United States Patent
Lee

(10) Patent No.: US 7,939,419 B2
(45) Date of Patent: May 10, 2011

(54) METHOD OF FILLING A TRENCH IN A SUBSTRATE

(75) Inventor: Ki-Sub Lee, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 254 days.

(21) Appl. No.: 12/277,339

(22) Filed: Nov. 25, 2008

(65) Prior Publication Data

US 2009/0137094 A1 May 28, 2009

(30) Foreign Application Priority Data

Nov. 27, 2007 (KR) .................. 10-2007-0121216

(51) Int. Cl.
*H01L 21/76* (2006.01)
(52) U.S. Cl. .................. 438/427; 438/424; 438/758
(58) Field of Classification Search .................. 438/424, 438/427, 758
See application file for complete search history.

(56) References Cited

U.S. PATENT DOCUMENTS

| 7,056,827 B2 | 6/2006 | Cha et al. |
| 2005/0136686 A1 | 6/2005 | Kim et al. |
| 2006/0183320 A1* | 8/2006 | Cha et al. .................. 438/637 |

FOREIGN PATENT DOCUMENTS

KR 1020050057964 6/2005

* cited by examiner

*Primary Examiner* — Bradley K Smith
(74) *Attorney, Agent, or Firm* — Volentine & Whitt, PLLC

(57) ABSTRACT

A method of filling a trench includes: providing a substrate having an upper surface, and a trench extending therein from the upper surface; forming a deposition layer on the substrate in a manner in which the layer partially fills the trench and has a portion which overhangs the trench at the upper surface of the substrate; etching, in a processing chamber, the portion of the deposition layer which overhangs the trench, including by inducing a reaction in the processing chamber using plasma; and subsequently depositing material on the substrate within the partially filled trench, including by inducing a reaction in the processing chamber using plasma.

11 Claims, 7 Drawing Sheets

METHOD OF FILLING A TRENCH IN A SUBSTRATE

BACKGROUND

1. Field of the Invention

The present invention relates to a shallow trench isolation process or the like for use in the manufacturing of semiconductor devices. More particularly, the present invention relates to a method of filling trenches in a substrate during the manufacturing of a semiconductor device.

2. Description of the Related Art

Shallow trench isolation (hereinafter, referred to as 'STI') is a technique used in the manufacturing of semiconductor devices. Specifically, STI is used to electrically isolate conductive patterns on a surface of a substrate. In general, an STI process includes forming a trench of a given depth in the substrate, filling the trench with an insulation layer, and planarizing the insulation layer to expose the substrate. As semiconductor devices become more highly integrated, i.e., as conductive patterns become smaller and/or more densely packed on the surface of a substrate, the STI process is becoming increasingly important in the overall scheme of the semiconductor manufacturing process. In this respect, trenches in the substrate must be made narrower and deeper to increase the degree to which a semiconductor device can be integrated, e.g., to provide room for the conductive patterns of a highly integrated semiconductor device.

In addition, the STI process must be reproducible. In this respect, the STI process must be able to fill trenches with a high degree of consistency. However, the reproducibility of the trench-filling process decreases as the trenches become narrower and as the depth of trenches increases to meet the demand for more highly integrated semiconductor devices. In particular, voids can sometimes be left in an insulation layer formed to fill a relatively narrow and deep trench during an STI process. In this case, the voids adversely affect the reliability of the semiconductor device.

A technique of filling a trench using a high-density plasma oxide has been developed due to the rapidity at which a trench can be filled. In general, a plasma reaction is induced in process gas, a substrate provided with trenches is exposed to the plasma and, as a result, an oxide layer is formed on the substrate including within the trenches. According to this plasma enhanced chemical vapor deposition technique, the process gas is under a low pressure and is excited using a high radio frequency power. Thus, the resulting oxide layer has a high density compared to a thermal oxide layer, a USG oxide, or a BPSG oxide formed by a typical CVD process.

Moreover, in this technique, plasma ions continuously collide with the surface of the oxide layer being formed at the bottom of the trench, thereby sputtering the oxide material. Characteristically, the high-density plasma oxide layer is re-deposited on vertical surfaces that define the sides of the trench (surfaces normal to what is considered to be the direction of the plasma reaction) such that the trench is filled rapidly. Thus, the deposition layer formed by this technique has a dominant vertical characteristic.

However, material sputtered from a layer formed on the bottom of a trench and re-deposited on the side of the trench can form an overhang that blocks the top of the trench before the oxide layer completely fills the trench. In such a case, a void is formed inside that part of the high-density plasma oxide layer which occupies the trench. To avoid this problem, the overhang of the high-density plasma oxide layer is removed by isotropically etching the layer, and another high-density plasma oxide layer is formed to complete the filling of the trench. Thus, a stacked high-density plasma oxide layer is formed.

More specifically, for example, a first high-density plasma oxide layer having a given thickness is formed within a trench. Then the first high-density plasma oxide layer is wet etched to remove any overhang. Subsequently, a thermal oxide layer and a second high-density plasma oxide layer are formed, i.e., are stacked on the remaining portion of the first high-density plasma oxide, thereby filling the trench.

However, in such a method of filling a trench, the substrate must be transported to different pieces of equipment in sequentially carrying out the deposition process of forming the first high-density plasma oxide layer, the wet etching process, the deposition process of forming the thermal oxide layer, and the deposition process of forming the second high-density plasma oxide layer. Transferring the substrates between, into and out of these pieces of equipment takes time and thus detracts from the productivity of the semiconductor device manufacturing process.

SUMMARY

An object of the invention is to provide a method of filling a trench in a semiconductor substrate or the like, which method can be carried out in a relatively short amount of time. That is, an object of the invention is to provide a method of filling a trench in a semiconductor substrate or the like, which enhances the efficiency of the overall process of manufacturing semiconductor devices.

Similarly, another object of the present invention is to provide a method of filling a trench in a semiconductor substrate or the like, which method can be carried out in a relatively short amount of time and yet prevents a void from being left within the filled trench.

According to one aspect of the present invention, there is provided a method of filling a trench in which a portion of a conformal deposition layer which overhangs a trench is first etched in a processing chamber using a plasma-induced reaction, and then the deposition layer is built up from the bottom of the resulting trench using a plasma-induced reaction carried out in the same processing chamber. In this case, the substrate is not removed from the processing chamber between processes. Moreover, the deposition layer can be built up from the bottom of the trench by using an ISEA (in-situ etch association) process in which material is removed from sides of the trench while deposition occurs at the bottom of the trench.

According to another aspect of the invention, there is provided a method of filling a trench in a substrate, which includes forming a deposition layer of high-density plasma oxide on the substrate which partially fills the trench by inducing a reaction of oxygen and $SiH_4$ using plasma, removing high-density plasma oxide from at least the upper surface of the substrate (i.e., from the upper surface of the substrate and additionally from the periphery of an upper part of the trench) by inducing a reaction of $NF_3$ and oxygen using plasma, and an ISEA process of removing remaining high-density plasma oxide from sides of the trench and simultaneously building up high-density plasma oxide on the bottom of the trench using a combination of $NF_3$, oxygen and $SiH_4$.

According to another aspect of the invention, the process by which the high-density plasma oxide is removed from the upper surface of the substrate or from the periphery of the upper part of the trench, and the ISEA process may be repeatedly performed.

According to another aspect of the invention, objects of the present invention are achieved using high-density plasma oxide to fill the trench. A method of filling a trench in a substrate begins by forming a first high-density plasma oxide layer on the substrate by inducing a reaction of oxygen and $SiH_4$ using plasma. Next, the first high-density plasma oxide layer at the sides of the trench is etched and simultaneously a second high-density plasma oxide layer is formed on the first high-density plasma oxide layer at the bottom of the trench using a combination of $NF_3$, oxygen and $SiH_4$. Then a high-density plasma oxide of the resulting layers is removed from an upper surface of the substrate and/or from the periphery of an upper part of the trench by inducing a reaction of $NF_3$ and oxygen using plasma. Subsequently, high-density plasma oxide is removed from sides of the trench while a third high-density plasma oxide layer is simultaneously formed in the trench by using a combination of $NF_3$, oxygen and $SiH_4$.

According to still another aspect of the invention, the method can be applied to fill a trench in a substrate on which a hard mask layer that was used to form the trench remains. In this case, the method begins with an initial process of forming a first high-density plasma oxide layer on the substrate using a plasma-induced reaction and simultaneously etching the hard mask layer using a plasma-induced reaction. The plasma induced reactions are facilitated using a combination of $NF_3$, oxygen and $SiH_4$. Next, a second high-density plasma oxide layer is formed over the entirety of the substrate by inducing a reaction of oxygen and $SiH_4$ using plasma. High-density plasma oxide of the resulting layers is then removed from an upper surface of the substrate and/or on the periphery of an upper part of the trench by inducing a reaction of $NF_3$ gas and oxygen using plasma. Subsequently, high-density plasma oxide is removed from sides of the trench, and simultaneously a third high-density plasma oxide is formed at the bottom of the trench using a combination of $NF_3$, oxygen and $SiH_4$.

BRIEF DESCRIPTION OF THE DRAWINGS

The embodiments of the present invention will be described in more detail below with reference to the attached drawings, in which.

DETAILED DESCRIPTION OF THE EMBODIMENTS

Figure 1:
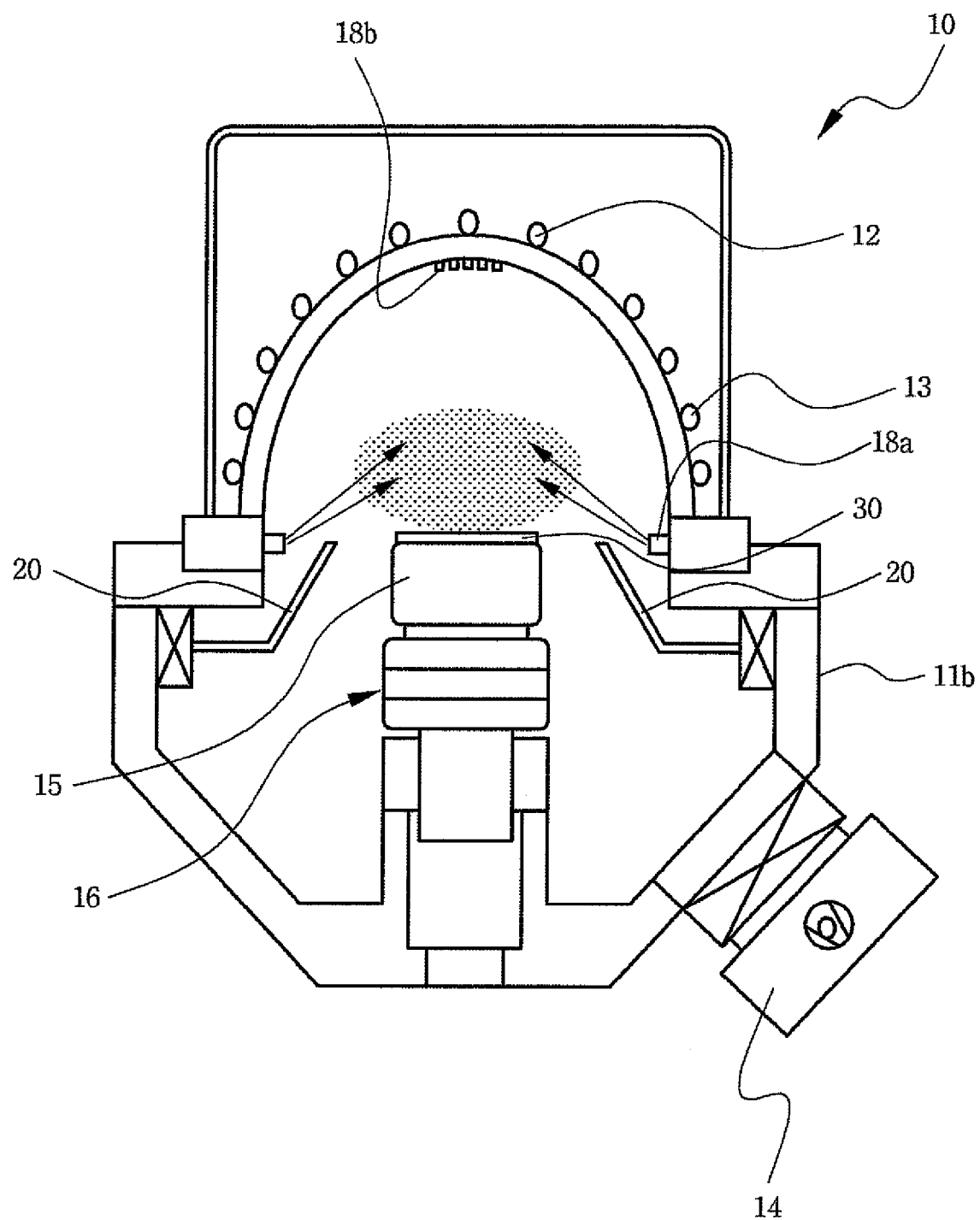
FIG. 1 is a sectional view of a plasma processing apparatus that can be used to carry out embodiments of a method of filling a trench according to the invention.

The present invention will now be described more fully with reference to the accompanying drawings. Note, like reference numerals are used to designate like or similar elements throughout the drawings.

FIG. 1 shows a plasma processing apparatus which can be used to carry out a method of filling a trench according the invention. The plasma processing apparatus includes an air-tight chamber 10, a chuck assembly 16 for supporting a substrate 30 at the center of the chamber 10, and reactive gas nozzles 18a and 18b mounted to the side of the chamber 10 at the periphery of the chuck assembly 16 and to the top of the chamber 10. The reactive gas nozzles 18a and 18b are for spraying reactive gas into the chamber 10 towards a substrate 30 supported by the chuck assembly 16. More specifically, the reactive gas nozzles 18a and 18b are connected to a gas supply system (not shown). The gas supply system includes supplies of a plasma source gas used for inducing a plasma reaction within the chamber 10a, process source gas for forming deposition material, namely the high-density plasma oxide, on the substrate 30 supported by the chuck assembly 16, and etching gas.

The plasma processing apparatus also includes cleaning gas nozzles 20 mounted to the side of the chamber 10 and disposed below the reactive gas nozzles 18a. The cleaning gas nozzles 20 are used to spray a cleaning gas into the chamber 10 for cleaning the chamber. The cleaning gas nozzles 20 are also coupled to a vacuum pump 14 so that air containing process gas and the cleaning gas can be pumped from the chamber 10. For example, the vacuum pump 14 comprises a turbo pump for pumping air out of the chamber 10 at a rate that can produce a high vacuum pressure of about $1 \times 10^{-6}$ Torr, and a dry pump for pumping air out of the chamber 10 at a rate that can produce a low vacuum pressure of $1 \times 10^{-3}$ Torr.

The plasma processing apparatus also includes a side electrode 13 disposed on the side of the chamber 10 and a top electrode 12 disposed on the top of the chamber 10, and a bias electrode 15 integrated with the chuck assembly 16. The top electrode 12 and the side electrode 13 serve as an anode by which high frequency power is applied to the gas sprayed into the chamber. The bias electrode 15 has an opposite polarity to the anode and serves as a cathode by which a lower level of high frequency power is applied to gas in the chamber 10.

A plasma reaction of reactive gas sprayed from the reactive gas nozzles 18a and 18b is induced by the plasma source gas when high frequency power is supplied into the chamber through side electrode 13 and top electrode 12, and the plasma source gas and reactive gas are sprayed from the reactive gas nozzles 18a and 18b. The plasma reaction causes reactive gas sprayed from the reactive gas nozzles 18a and 18b to mix evenly, activates the reactive gas, and separates the plasma source gas into free electrons and ions at a high temperature. A bias voltage impressed through the bias electrode 15 concentrates the plasma source gas and reactive gas on the substrate 30. Accordingly, the substrate 30 is processed, e.g., material is deposited on the substrate 30.

According to the present invention, as will be described in more detail below, not only is a deposition process carried out within the chamber 10, but a sputtering process of physically sputtering the deposition material, and an etching process of chemically etching the deposition material are also performed within the chamber 10 (independently of one another or concurrently). Therefore, using the apparatus described above, a high-density plasma oxide layer can be formed on a substrate and chemically etched within one chamber, so that a trench can be filled rapidly and without voids being formed in the material filling the trench.

A first embodiment of a method of filling a trench according to the invention, employing such a plasma processing apparatus, will now be explained in more detail with reference to the flowchart of FIG. 2, and FIGS. 3-6.

Figure 2:
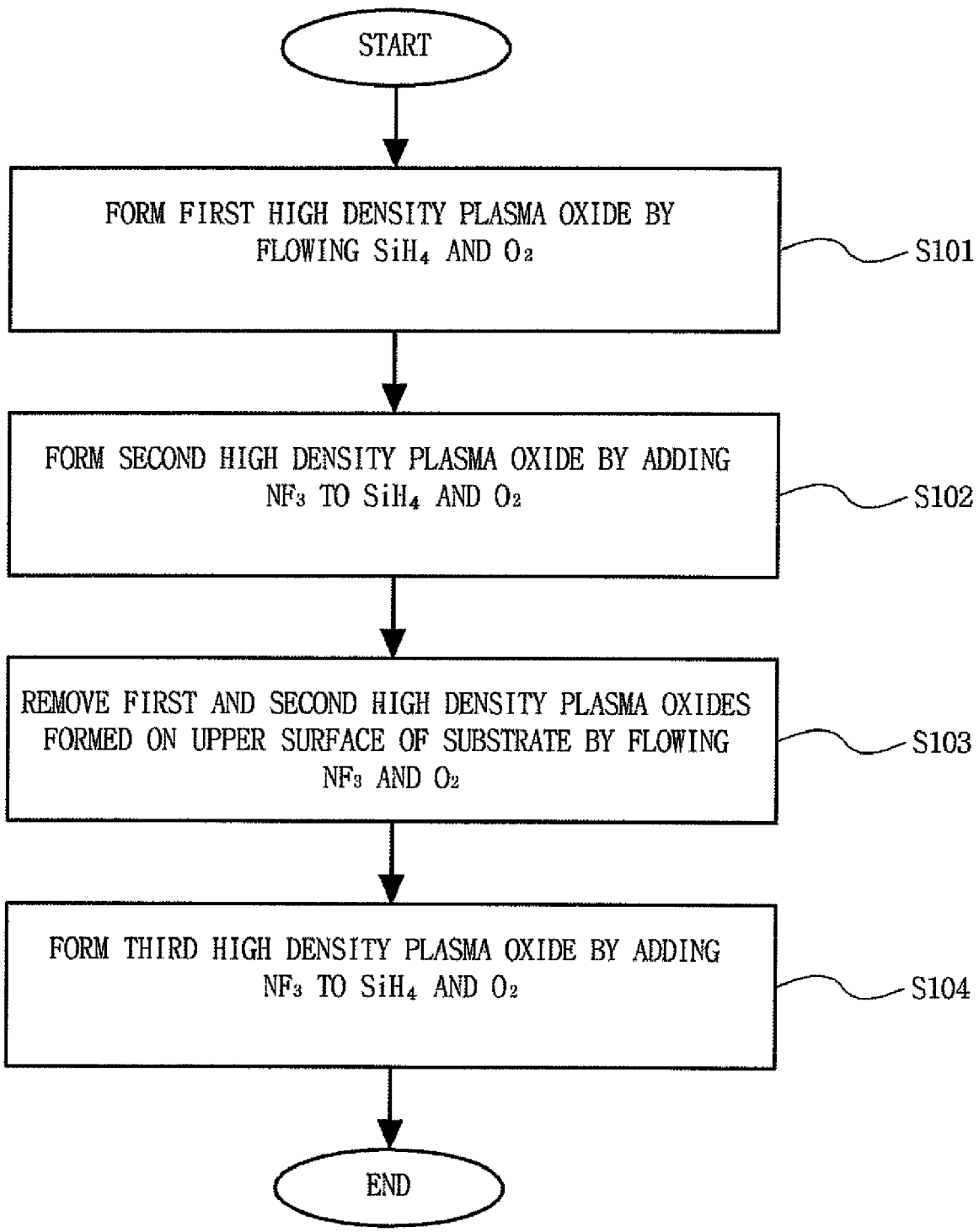
FIG. 2 is a flowchart of a first embodiment of a method of filling a trench according to the invention.

First, a first high-density plasma oxide layer 32 (FIG. 3) is formed on a substrate 30 using process source gas comprising a combination of $SiH_4$ and $O_2$ (S101 in FIG. 2). More specifically, the substrate 30 is loaded into the chamber 10, and the chamber 10 is evacuated until a high vacuum pressure level of about $1\times10^{-6}$ Torr is created in the chamber 10. Then, the chamber 10 is filled with plasma source gas and the process source gas, and a low vacuum pressure level of about $1\times10^{-3}$ Torr is maintained in the chamber 10. The plasma source gas may be He. In this example, the He is supplied into the chamber 10 at a flow rate of about 100 sccm to about 200 sccm, the $O_2$ is supplied into the chamber 10 at a flow rate of about 50 sccm to about 90 sccm, and the $SiH_4$ is supplied into the chamber 10 at a flow rate of about 20 sccm to about 30 scam. At this time, the process source gas and plasma source gas are sprayed into the chamber 10 only from the reactive gas nozzles 18a, i.e., from the side of the chamber 10.

High frequency power is supplied to the top electrode 12 and the side electrode 13, thereby exciting the plasma source gas, i.e., inducing a plasma reaction. Also, as a result, the process source gas is mixed and activated. For example, high frequency power of about 3000 W to about 6000 W is supplied to the top electrode 12 and the side electrode 13. Also, at this time, a high frequency power of about 1000 W to about 2000 W is supplied to the bias electrode 15. Accordingly, the plasma source gas and process source gas are concentrated at the surface of the substrate 30 where the process source gas reacts. The reaction forms the first high-density plasma oxide layer 32 on the substrate 30.

Furthermore, the high frequency power applied to the bias electrode 15 accelerates the plasma source gas (He) towards the chuck assembly 16. Thus, the first high-density plasma oxide layer 32 formed on the substrate 30 is sputtered. That portion of the first high-density plasma oxide layer 32 which is removed (sputtered) from horizontal surfaces of the substrate 30 is re-deposited on vertical surfaces of the substrate 30 so that the trenches are filled rapidly with high-density plasma oxide. However, the resulting first high-density plasma oxide layer must not produce an overhang at the opening of a trench.

He has a relatively low atomic weight, e.g., as compared to Ar which is commonly used as a plasma source gas. Furthermore, the magnitude of the high frequency power supplied to the bias electrode 15 is controlled to correspond to the atomic weight of He. Therefore, the kinetic energy transferred to the first high-density plasma oxide layer by the He, i.e., the amount of sputtering that occurs, is limited so that an excessive overhang is not produced at the top of a trench.

According to an example of the present invention, the above-described process conditions are maintained for about 25 to 35 seconds. In this case, the first high-density plasma oxide layer 32 is formed to a thickness of about 1000 Å to about 1500 Å. Note, in FIG. 3 reference numeral 31 designates the remains of a hard mask layer that was used as an etching mask to form the trenches in the substrate 30, as is conventional per se. That is, part of the hard mask layer is removed during the forming of the trenches and thus, part of the hard mask layer 31 remains on an upper surface of the substrate 30. Also, as can be seen from FIG. 3, the thickness of the first high-density plasma oxide layer 32 at the bottom of trench is similar to the thickness of the first high-density plasma oxide layer 32 at the upper surface of the substrate 30 alongside the periphery of trench. Furthermore, the profile of the first high-density plasma oxide layer 32 at the upper portion of the trench has the shape of a candle's flame or mushroom especially when the trenches are spaced close together. In this case, therefore, the first high-density plasma oxide layer 32 has a slight overhang at the upper part of trench.

Figure 3:
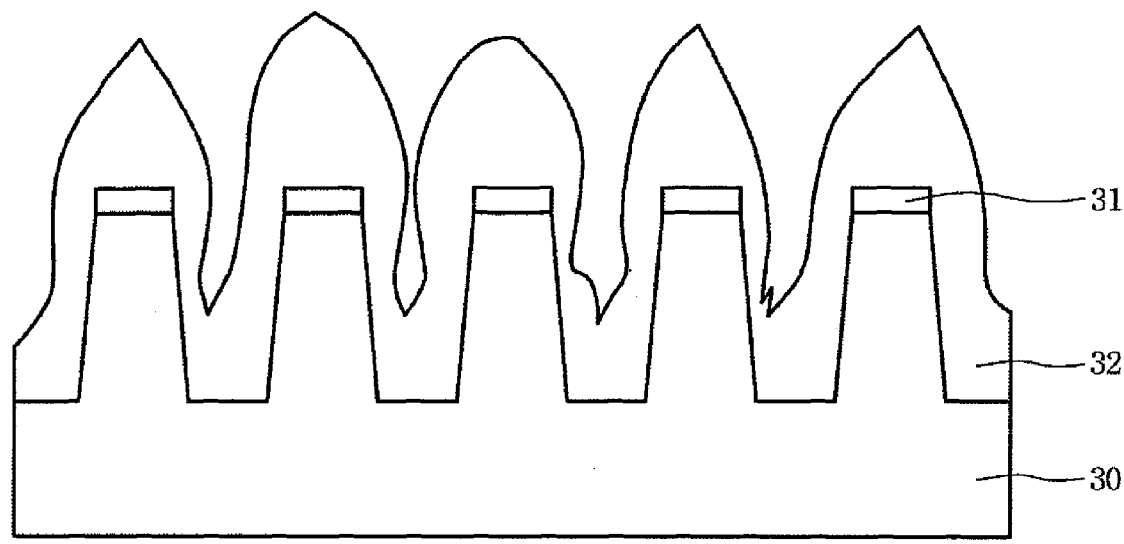
FIGS. 3 to 6 are each a sectional view of a substrate in which trenches are provided and together illustrate a method of filling the trenches, using a high-density plasma oxide, according to the sequence shown by the flowchart of FIG. 2.

Next, a second high-density plasma oxide layer 34 (FIG. 4) is formed on the first plasma oxide layer 32 (S102 in FIG. 3).

In this process, those portions of the first high-density plasma oxide layer 32 which protrude from an upper part of the substrate 30 or a side of a trench are etched. To this end, $NF_3$ is supplied together with the process source gas (oxygen and $SiH_4$) into the upper part of the process chamber 10 through the reactive gas nozzles 18b to form the second high-density plasma oxide layer 34. In addition, hydrogen is supplied into the process chamber 10 through the reactive gas nozzles 18a and 18b. High frequency power supplied to the top electrode 12 and the side electrode 13 excites the hydrogen, i.e., induces a plasma reaction in the process source gas to form the second high-density oxide layer 34. The hydrogen also chemically reacts with $NF_3$ to produce a strong acid (HF) capable of chemically etching the first high-density plasma oxide layer 32.

Thus, the hydrogen serves as plasma source gas to activate the process source gas to form the second high-density plasma oxide layer 34. The hydrogen also serves as an etching gas along with $NF_3$ to remove overhanging portions of the first high-density plasma oxide layer 32. That is, on the one hand, the hydrogen sprayed into the chamber 10, together with oxygen and $SiH_4$, from the reactive gas nozzles 18a form the second high-density plasma oxide layer 34. At this time, a portion of $SiH_4$ is also sprayed into the chamber 10 from the reactive gas nozzles 18b at the upper part of the chamber 10. On the other hand, hydrogen and $NF_3$ supplied into the process chamber 10 through the reactive gas nozzles 18b etch the first high-density plasma oxide layer 32.

According to an example of S102 the present invention as described above, $NF_3$ is sprayed from the reactive gas nozzles 18b at a flow rate of about 40 sccm to about 60 sccm, hydrogen is sprayed from the reactive gas nozzles 18b at a flow rate of about 150 sccm, and $SiH_4$ is sprayed from the reactive gas nozzles 18b at a flow rate of about 30 sccm to about 40 sccm. On the other hand, oxygen is sprayed from the reactive gas nozzles 18a at a flow rate of about 70 sccm to about 100 sccm, $SiH_4$ is sprayed from the reactive gas nozzles 18a at a flow rate of about 5 sccm to about 15 sccm, and hydrogen is sprayed from the reactive gas nozzles 18a at a flow rate of about 400 sccm to about 700 sccm. Furthermore, high frequency power of about 3000 W to about 6000 W is supplied to the top electrode 12 and side electrode 13. High frequency power of about 1000 W to about 2500 W is supplied to the bias electrode 15. The above-described process conditions are maintained for about 15 to 25 seconds and as a result, the second high-density plasma oxide layer 34 is formed to a thickness of about 700 Å.

As described above, the $NF_3$ and hydrogen sprayed from the reactive gas nozzles 18b into the chamber 10 remove portions of the first high-density plasma oxide layer 32 exposed at the upper surface of the substrate 30 including along the periphery of the trench. At this time, portions of the second high-density plasma oxide layer 34 form on the upper surface of the substrate 30 and on sides of the trench. Regardless, the second high-density plasma oxide layer 34 is chemically etched by the $NF_3$ and hydrogen. That is, the $NF_3$ and hydrogen are capable of etching the first and second high-density plasma oxide layers 32 and 34 from the upper surface of the substrate including from alongside the periphery of the trenches. Thus, portions of the high-density oxide layers which overhang the trenches are removed. On the other hand, the thickness of the deposition layer increases at the bottom of trench.

The concurrent depositing of high-density plasma oxide at the bottom of the trench, and the etching of the high-density plasma oxide layer at the upper surface of substrate 30 alongside the periphery of the trench will be referred to as an ISEA (in-situ etch association) process. In this respect, care must be taken to ensure that the ISEA process is not performed for too long a period of time. Otherwise, the first high-density plasma oxide layer 32 will be completely eliminated from the sides of the trench in which case the surface of substrate 30 could be damaged. On the other hand, the trench can not be subsequently filled to the top unless the height of first high-density plasma oxide layer 32 formed on the upper surface of substrate 30 is sufficiently reduced.

According to an example of the present invention, a stack of the first and second high-density plasma oxide layers 32 and 34 having a thickness of about 2000 Å is formed within a trench having a depth of about 3000 Å. The stack of the first and second high-density plasma oxide layers 32 and 34 have a thickness of about 1000 Å or more on the upper surface of the substrate alongside the periphery of the trench. Therefore, the resulting trench has a depth of about 2000 Å. Subsequently, more of the deposition layer is removed from the periphery of the trench at the upper surface of the substrate 30.

Figure 5:
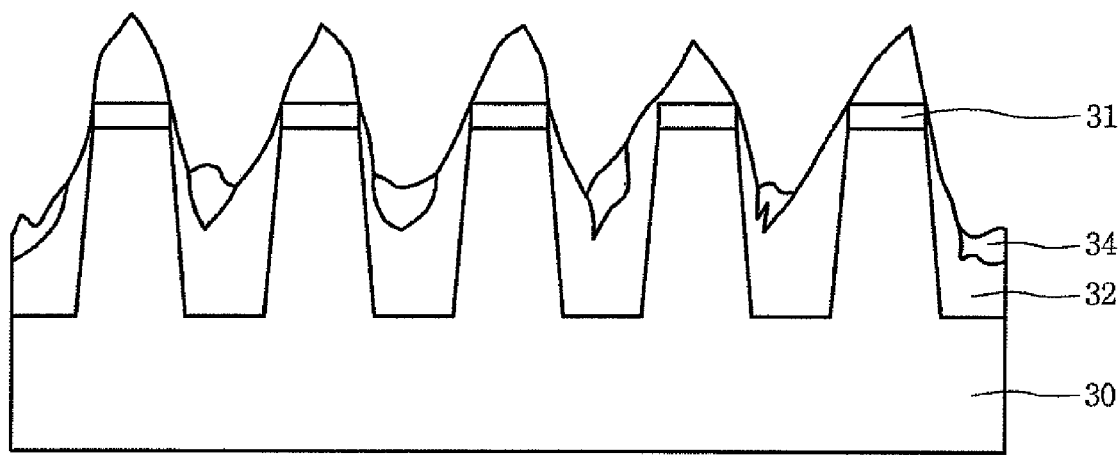

To this end, the deposition layer is etched (S103 in FIG. 2). Specifically, $NF_3$ is sprayed from the reactive gas nozzles 18b at the upper portion of the chamber 10, and oxygen and Ar are sprayed from the reactive gas nozzles 18a at the sides of the chamber 10. Also, high frequency power is supplied to the electrodes 12 and 13. Thus, the Ar induces a plasma reaction in which the $NF_3$ and oxygen chemically react. As a result, the high-density plasma oxide deposition layer exposed at the upper surface of the substrate 30 is etched; in addition, the first high-density plasma oxide layer 32 exposed at the upper surface of the substrate 30 is sputtered (FIG. 5).

According to an example of S103 of the present invention as described above, the $NF_3$ is supplied into the chamber 10 at a flow rate of about 150 sccm to about 250 sccm, the Ar is supplied into the chamber 10 at a flow rate of about 100 sccm to about 200 sccm, and the oxygen is supplied into the chamber 10 at a flow rate of about 200 sccm to about 300 sccm. Also, high frequency power of about 4000 W to about 6000 W is supplied to top electrode 12, and high frequency power of about 500 W to about 1500 W is supplied to side electrode 13. Furthermore, high frequency power of about 1000 W to about 1500 W is supplied to bias electrode 15.

Figure 4:
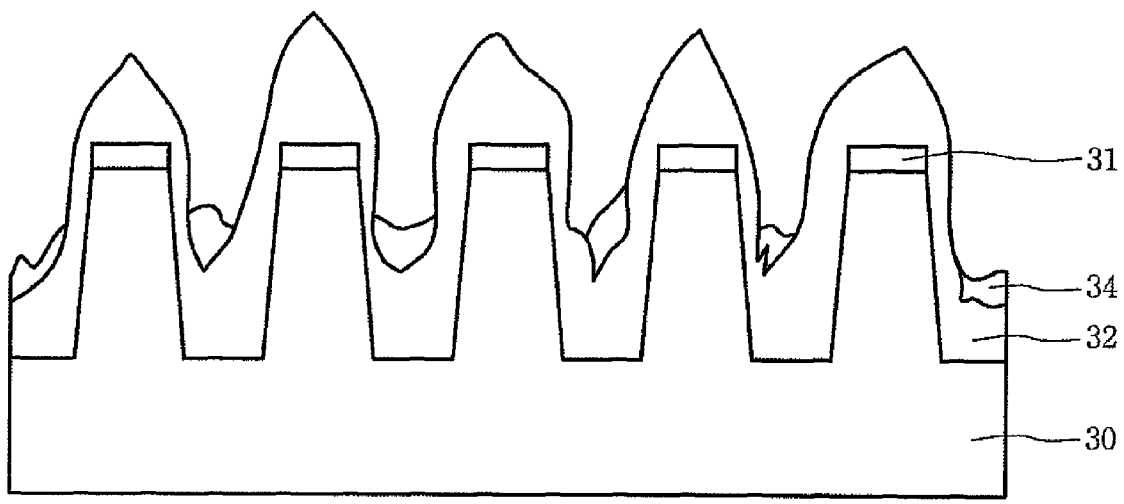

In this respect, lower levels of high frequency power are supplied to the side electrode 13 and bias electrode 15 in the process of etching the first and second plasma oxide layers 32 and 34 (FIG. 5) than in the process of forming the first and second high-density plasma oxide layers 32 and 34 (FIGS. 3 and 4). This is because Ar has a greater atomic weight than He and hydrogen. Thus, the provision of lower levels of high frequency power prevents the first and second high-density plasma oxide layers 32 and 34 from being over-etched. That is, the provision of the low level of high frequency power to the bias electrode 15 prevents the Ar, having a relatively high atomic weight, from over-etching not only the upper part of the substrate 30 but also prevents the first and second high-density plasma oxide layers 32 and 34 from being etched away at the bottom of trench.

According to an example of S103 of the present invention, the above-mentioned process conditions are maintained for about 5 to 15 seconds. At the beginning, the deposition layer forms protrusions having pointed tips between the trenches at the upper surface of the substrate. These pointed portions of the deposition layer can be etched two to four times faster than generally planar portions of the same. Thus, the depth of a trench can be greatly reduced rapidly through the etching away of the pointed protrusions of the deposition layer located at the upper surface of the substrate or alongside the periphery of the trench. In particular, a portion of the deposition layer having a thickness of about 500 Å is removed from the upper surface of substrate 30 alongside the periphery of trench, whose depth had stood at about 2000 Å. The resulting trench thus has a depth of about 1500 Å or less.

Furthermore, at this time, portions of the deposition layer formed on the upper surface of the substrate 30 and overhanging the trenches are completely removed. Furthermore, the width of each trench is increased as a result. Thus, these remaining trenches can be easily filled in.

Figure 6:
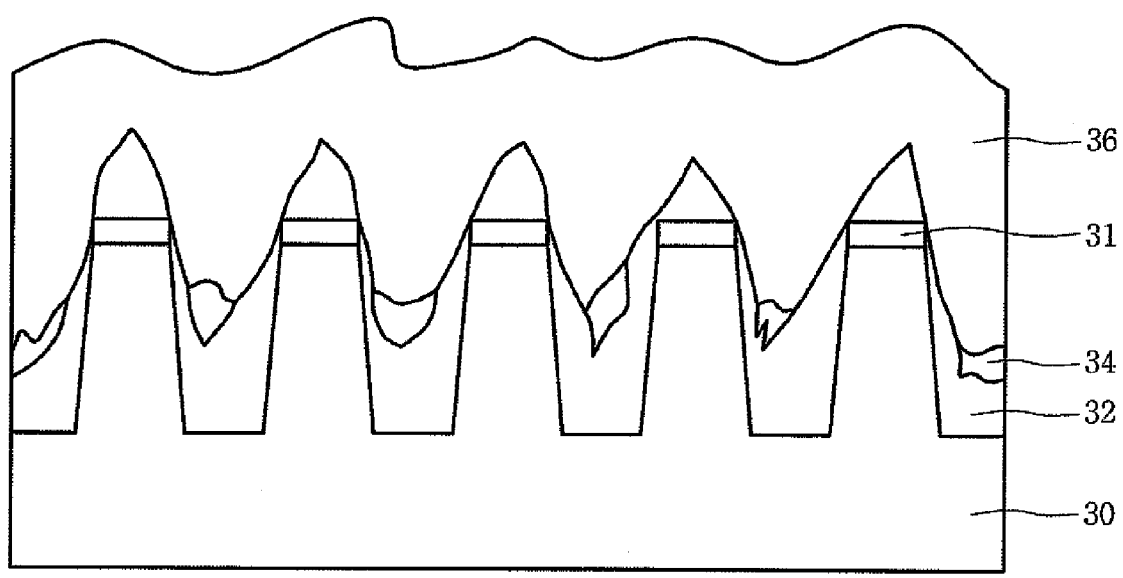

Specifically, a third high-density plasma oxide layer 36 is formed (S104 in FIG. 2) over the remaining stack of the first and second high-density plasma oxide layers 32 and 34 to fill in the trenches (FIG. 6). The third high-density plasma oxide layer 36 may be formed through an ISEA process. That is, the third high-density plasma oxide layer 36 is formed on the bottom of the trench, while the deposition layer remaining on the upper surface of substrate 30 or along the sides of the trench is etched. The third high-density plasma oxide layer 36 may be formed by supplying $NF_3$, hydrogen, oxygen and $SiH_4$ as process source gas into the chamber 10. The plasma source gas is hydrogen. As described above, $NF_3$ and a portion of the hydrogen are sprayed through reactive gas nozzles 18b into an upper part of the chamber 10. The rest of the hydrogen, and oxygen and $SiH_4$ are sprayed from the reactive gas nozzles 18a at the side of the chamber 10.

According to an example of S104 of the present invention, $NF_3$ is sprayed from the reactive gas nozzles 18b at a flow rate of about 60 sccm to about 90 sccm, and hydrogen at a flow rate of about 500 sccm to about 700 sccm. Furthermore, oxygen is sprayed from the reactive gas nozzles 18a at a flow rate of about 70 sccm to about 100 sccm, $SiH_4$ at a flow rate of about 5 sccm to about 15 sccm, and hydrogen at a flow rate of about 200 sccm to about 400 sccm. Also, high frequency power of about 3000 W to about 6000 W is supplied to the top electrode 12 and the side electrode 13. High frequency power of about 2500 W to about 3500 W is supplied to the bias electrode 15. Thus, the flow rates of $NF_3$ and hydrogen are higher when forming the third high-density plasma oxide layer 36 than when forming the second high-density plasma oxide layer 34. Also, the magnitude of the high frequency power applied to the bias electrode 15 is greater. The above-described process conditions may be maintained for about 50 to 70 seconds to form the third high-density plasma oxide layer 36 to a thickness of about 1500 Å to about 2000 Å as measured from the upper surface of the substrate 30.

Subsequently, the etching process (S103) and the ISEA (S104) process can be repeated as necessary to completely fill the trench. For example, after the ISEA process (104) is performed, an etching process corresponding to that described above in connection with FIG. 5 is performed. Then, an ISEA process, corresponding to that described above in connection with FIG. 6 and another corresponding etching process may be performed one to five additional times. In this way, the trench can be filled without any voids being left in the material occupying the trench. Note, the ISEA process must be performed as the final process in this sequence.

Then, a capping layer may be formed over the resulting structure using a high-density plasma chemical vapor deposition method. Finally, a chemical mechanical polishing process is carried out beginning on the exposed capping layer to impart a flat surface to the structure.

According to the first embodiment of a method of filling a trench as described above, deposition processes of forming first and second high-density plasma oxide layers 32 and 34 within a trench, an etching process of removing deposited material which overhangs the trench, and an ISEA process of forming third high-density plasma oxide layer 36 are performed within the same process chamber 10. Thus, these processes can be carried out with a high degree of efficiency, i.e., the trench can be filled in a relatively short amount of time without leaving a void in the material occupying the trench. Therefore, the present invention can be practiced to enhance the overall productivity of a semiconductor device manufacturing process.

A second embodiment of a method of filling a trench according to the invention will now be described in detail with reference to the flowchart of FIG. 7, and the sectional views of FIGS. 8 to 11.

Figure 8:
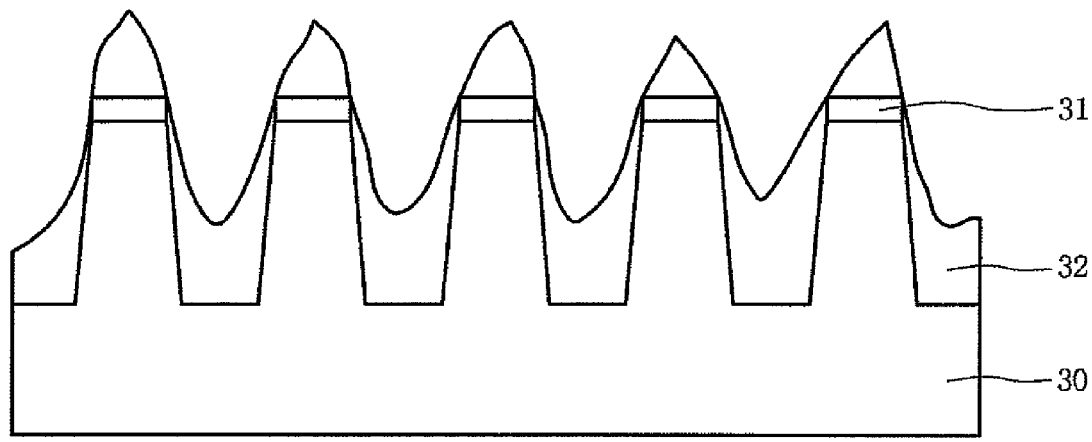
FIGS. 8 to 11 are each a sectional view of a substrate in which trenches are provided and together illustrate a method of filling the trenches, using a high-density plasma oxide, according to the sequence shown by the flowchart of FIG. 7.

First, a first high-density plasma oxide layer 32 is formed (S201) on a substrate 30 having trenches (FIG. 8). More specifically, a substrate 30 having trenches and a hard mask layer 31 (which was used for forming the trenches according to a process known per se) is loaded into the chamber 10. The chamber 10 is evacuated until a high vacuum level of about $1\times10^{-6}$ Torr is established in the chamber 10, and then the chamber is filled with plasma source gas and process source gas. At this time, a low vacuum level of about $1\times10^{-3}$ Torr is maintained in the chamber 10. The plasma source comprises $H_2$, and the process source gas comprises $NF_3$, oxygen and $SiH_4$.

More specifically, the $NF_3$ and a portion of hydrogen are sprayed through reactive gas nozzles 18*b* into an upper part of the chamber 10, and the rest of the hydrogen is sprayed through reactive gas nozzles 18*a* at the side of the chamber 10. $SiH_4$ is sprayed through the reactive gas nozzles 18*b*, separately from the $NF_3$, into the upper part of the chamber 10 and is also sprayed trough the reactive gas nozzles 18*a* at the side of the chamber 10. Oxygen is sprayed through the reaction gas nozzles 18*a* at the side of the chamber 10. High frequency power is supplied to the top electrode 12 and side electrode 13. A lower magnitude of high frequency power is supplied to the bias electrode 15. As a result, the first high-density plasma oxide layer 32 is formed on the upper surface of the substrate 30 and in the trench by an ISEA process similar to that described above in connection with S103 of the first embodiment.

As an example of this process (S201), the $NF_3$ is sprayed from the reactive gas nozzles 18*b* at a flow rate of about 10 sccm to about 40 sccm, hydrogen is sprayed from the reactive gas nozzles 18*b* at a flow rate of about 100 sccm, and $SiH_4$ is sprayed from the reactive gas nozzles 18*b* at a flow rate of about 30 sccm to about 40 sccm. Furthermore, oxygen is sprayed from reactive gas nozzles 18*a* at a flow rate of about 70 sccm to about 100 sccm, $SiH_4$ is sprayed from reactive gas nozzles 18*a* at a flow rate of about 5 sccm to about 15 sccm, and hydrogen is sprayed from reactive gas nozzles 18*a* at a flow rate of about 400 sccm to about 700 sccm. High frequency power of about 3000 W to about 6000 W is supplied to the top electrode 12 and side electrode 13. High frequency power of about 500 W to about 1500 W is supplied to the bias electrode 15. The above-mentioned process conditions are maintained for about 40 to 50 seconds to form the first high-density plasma oxide layer 32 to a thickness of about 800 Å to about 1200 Å as measured from the upper surface of the substrate 30.

In this embodiment, the high frequency power applied to the bias electrode 15 has a relatively low energy. Also, hydrogen, because it has a relatively low atomic weight, sputters the hard mask layer 31 at a low level of energy during the plasma-induced reaction which forms the first high-density oxide layer 32. Furthermore, hydrogen chemically reacts with $NF_3$ to chemically etch the hard mask layer 31 as well as the first high-density plasma oxide layer 32 that is being formed on the upper surface of the substrate 30. In other words, the hydrogen is used as both a plasma source gas for inducing a plasma reaction and as a process source gas for use in simultaneously carrying out an etching process. The hard mask layer 31 thus becomes a sacrificial layer in this process.

The $NF_3$ is supplied at a flow rate less than that of the $NF_3$ during a subsequent process of forming a third high-density plasma oxide layer 36 (described later). This is to prevent over-etching, and thereby ensure that the substrate is not damaged at the sides of the trench and below the hard mask layer 31.

Referring back to FIG. 8, as a result of the above-described ISEA process, the first high-density plasma oxide layer 32 is formed to be thicker within the trench than on the upper surface of the substrate 30 and without an overhang (i.e., the oxide layer 32 does not have any portions hanging over the trench at the upper surface of the substrate).

Figure 9:
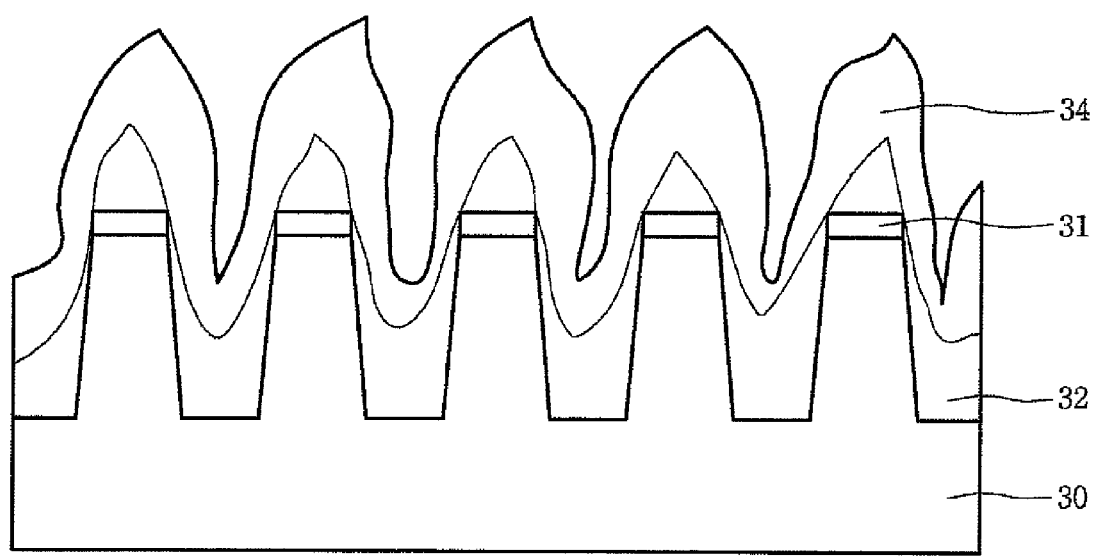

Next (S202), a second high-density plasma oxide layer 34 is formed on the first high-density plasma oxide layer 32 (FIG. 9). In this process, the plasma source gas may be He and the process source gas may be a combination of oxygen and $SiH_4$. For example, He is supplied into the chamber 10 at a flow rate of about 100 sccm to about 200 sccm, oxygen at a flow rate of about 50 sccm to about 90 sccm, and $SiH_4$ at a flow rate of about 20 sccm to about 30 sccm. In this process, the plasma source and plasma process gases are all sprayed from reactive gas nozzles 18*a* at the side of the chamber 10.

High frequency power is supplied to the top electrode 12 and the side electrode 13, to excite the plasma source gas to a plasma state and mix the process source gas. For example, high frequency power of about 3000 W to about 6000 W is supplied to top electrode 12 and side electrode 13. High frequency power of about 1000 W to about 2000 W is supplied to the bias electrode 15 to concentrate the plasma source gas and process source gas on the surface of the substrate 30. The above-mentioned process conditions are maintained for 10 to 20 seconds. In this example of the process S202 shown in FIG. 9, the second high-density plasma oxide layer 34 has a thickness of about 500 Å to about 1000 Å as measured from above the upper surface of the substrate 30.

Also, during this process, the high frequency power supplied to the bias electrode 15 accelerates the helium, i.e., the plasma source gas, towards the substrate. As a result, the plasma source gas physically sputters the first and second high-density plasma oxide layers 32 and 34 at the periphery of the upper portion of the trench and at the bottom of the trench. The sputtered oxide is re-deposited at the sides of the existing trench. As a result, the second high-density plasma oxide layer 34 is stacked on the first high-density plasma oxide layer 32, forming a deposition layer whose profile has the shape of a candle's flame or mushroom between adjacent trenches. That is, the re-deposited oxide material overhangs the bottom of the trench and as such, forms an impediment to the subsequent process of filling the trench.

Figure 10:
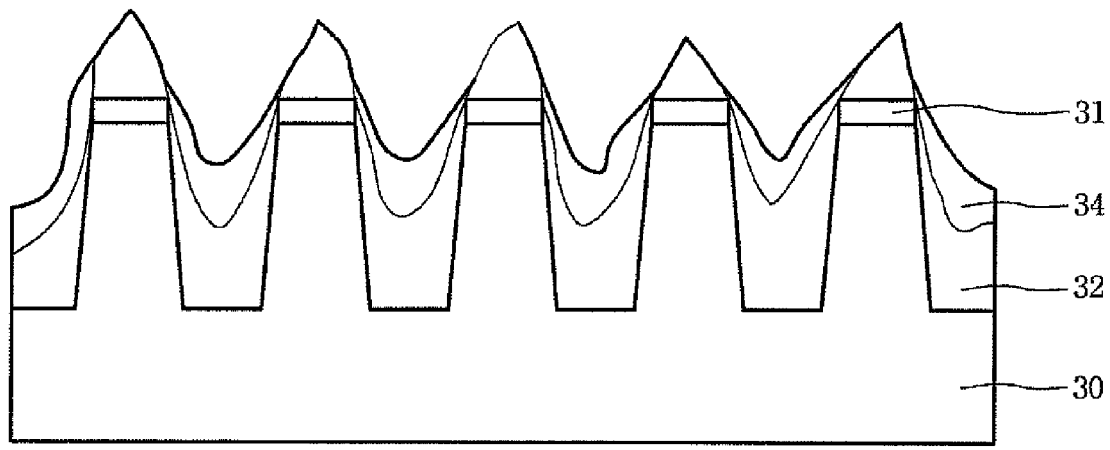

Accordingly, the deposition layer, and especially the second high-density plasma oxide layer 34, is then etched (S203) to remove the overhang (FIG. 10). To this end, a plasma reaction is induced by spraying $NF_3$ through the reactive gas nozzles 18*b* at the upper part of the chamber 10 and by spraying oxygen and Ar through the reactive gas nozzles 18*a* at the side of the chamber 10. In this case, the Ar is converted to plasma and induces a reaction of the $NF_3$ and oxygen. As a result, the $NF_3$ and oxygen etch the deposition layer exposed at the upper surface of the substrate 30. Furthermore, the first high-density plasma oxide layer 32 exposed at the upper surface of the substrate 30 is sputtered by the Ar.

As an example of this process, $NF_3$ is sprayed into the chamber 10 through the reactive gas nozzles 18b at a flow rate of about 150 sccm to about 250 sccm, Ar is sprayed into the chamber 10 through reactive gas nozzles 18a at a flow rate of about 100 sccm to about 200 sccm, and oxygen is sprayed into the chamber 10 through reactive gas nozzles 18a at a flow rate of about 200 sccm to about 300 sccm. Also, high frequency power of about 4000 W to about 6000 W is supplied to top electrode 12, and high frequency power of about 500 W to about 1500 W is supplied to side electrode 13. Furthermore, high frequency power of about 1500 W to about 2500 W is supplied to bias electrode 15. The above-described process conditions are maintained for about 5-15 seconds. In this case, the deposition layer is etched until it has a thickness of about 150 Å above the upper surface of the substrate 30. Thus, the depth of the exiting trench is reduced. In the case in which the trench existing at the time of the etching process (S203) has a depth of about 2000 Å, a portion of the deposition layer that is about 500 Å thick is removed from above the upper surface of substrate 30. Thus, the resulting trench has a depth of about 1500 Å or less. At the same time, the trench is widened. Accordingly, the remaining trench can be easily filled with a third high-density plasma oxide layer 36 (described in more detail below with reference to FIG. 11).

Moreover, in this process, the magnitude of the high frequency power supplied to the bias electrode 15 must be higher during the etching process than during the processes of forming the first and second high-density plasma oxide layers 32 and 34 so that the overhanging portion of the second high-density plasma oxide layer 34 can be removed effectively. Furthermore, the ability of the present invention to remove the overhanging portion of the second high-density plasma oxide layer 34 is enhanced by using Ar, which has a higher atomic weight than hydrogen or helium, to sputter the deposition layer. In any case, the pointed portions of the deposition layer, which protrude upwardly between the trenches, have a large surface area exposed at the upper surface of the substrate 30. Therefore, these portions of the deposition layer are etched two to four times faster than the portions of the deposition layer at the bottom of the trenches. Thus, the overhanging portions of the deposition layer are removed effectively from atop a trench without significantly increasing the depth of the trench.

Figure 7:
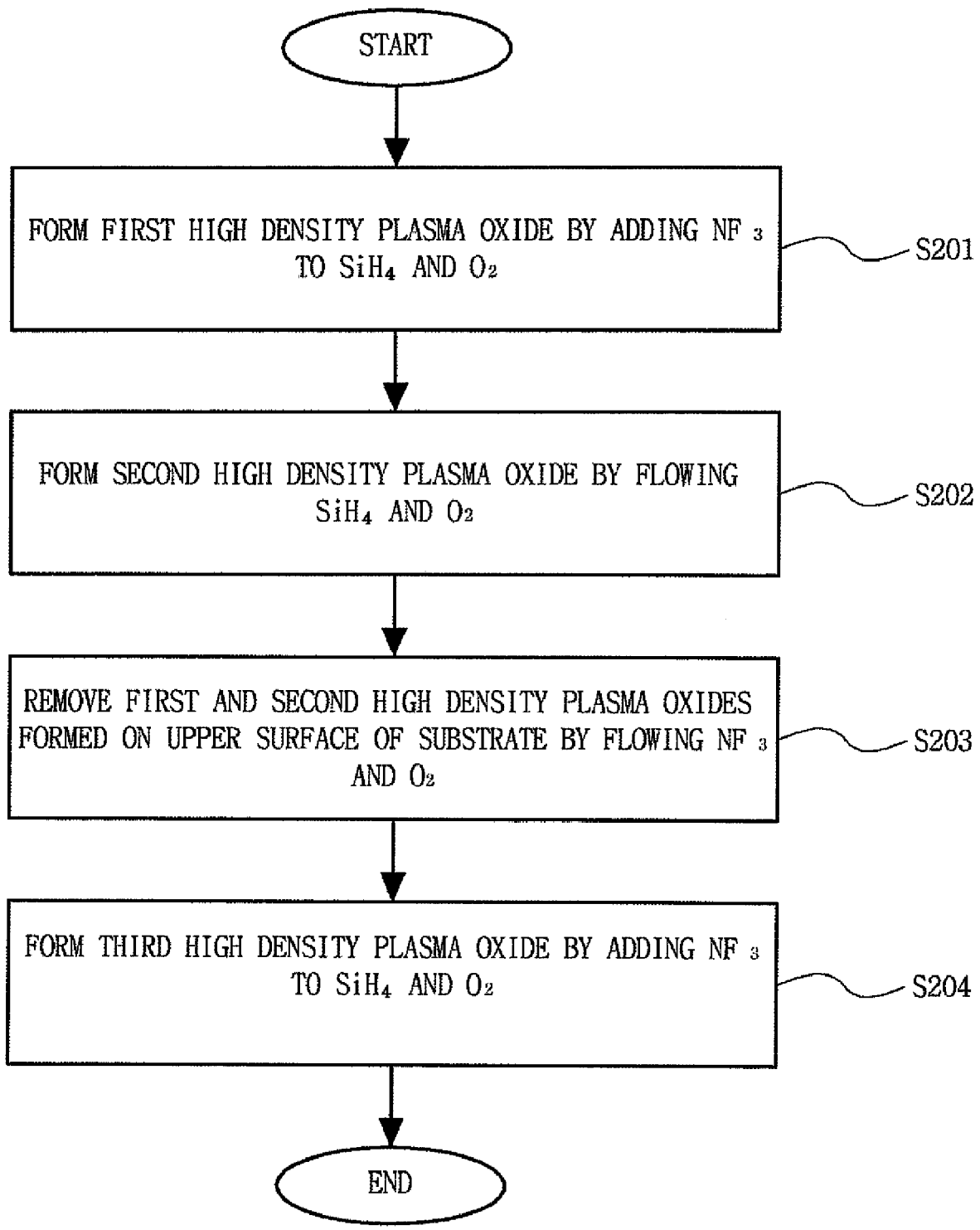
FIG. 7 is a flowchart of a second embodiment of a method of filling a trench according to the invention.
Figure 11:
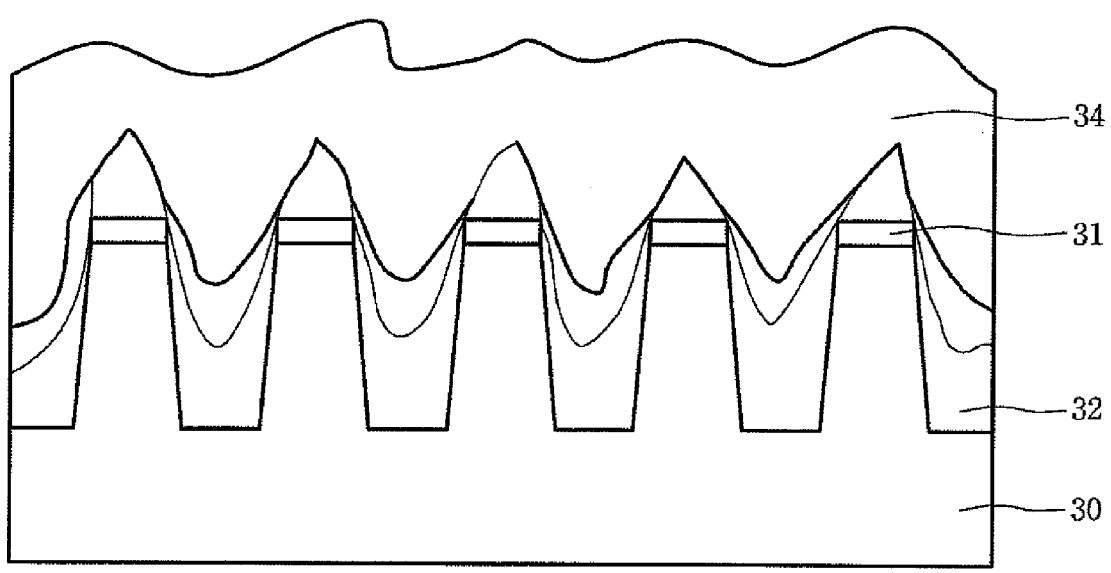

Next, as mentioned above, a third high-density plasma oxide layer 36 is formed to complete the filling of the existing trench (S204 in FIG. 7 and FIG. 11). The third high-density plasma oxide layer 36 may be formed by supplying $NF_3$, hydrogen, oxygen and $SiH_4$ as process source gas into the chamber 10, and by supplying hydrogen gas as plasma reaction gas into the chamber 10. Specifically, the $NF_3$ and a portion of the hydrogen are sprayed through the reactive gas nozzles 18b at the upper part of the chamber 10, and the rest of the hydrogen as well as the oxygen and $SiH_4$ are sprayed from the reactive gas nozzles 18a at the side of the chamber 10.

According to an example of this process, $NF_3$ is sprayed from the reactive gas nozzles 18b at a flow rate of about 60 sccm to about 90 sccm, hydrogen is sprayed from the reactive gas nozzles 18b at a flow rate of about 500 sccm to about 700 sccm, and Silt is sprayed from the reactive gas nozzles 18b at a flow rate of about 30 sccm to about 40 sccm. Furthermore, oxygen is sprayed from the reactive gas nozzles 18a at a flow rate of about 70 sccm to about 100 sccm, $SiH_4$ is sprayed from the reactive gas nozzles 18a at a flow rate of about 5 sccm to about 15 sccm, and hydrogen is sprayed from the reactive gas nozzles 18a at a flow rate of about 200 sccm to about 400 sccm. Furthermore, high frequency power of about 3000 W to about 6000 W is supplied to the top electrode 12 and side electrode 13. High frequency power of about 2500 W to about 3500 W is supplied to the bias electrode 15. In this example, therefore, the flow rates of $NF_3$ and hydrogen during the forming of the third high-density plasma oxide layer 36 are greater than those provided in the forming of the first high-density plasma oxide layer 32, and the high frequency power supplied to the bias electrode 15 is comparatively greater as well.

The above-mentioned process conditions are maintained for about 50 to 70 seconds, for example. As a result, the third high-density plasma oxide layer 36 is formed to a thickness of about 1500 Å to about 2000 Å as measured from the upper surface of the substrate 30 through.

In this way, the third high-density plasma oxide layer 36 is formed by an ISEA process. That is, a portion of the existing deposition layer is etched away at the upper surface of the substrate 30 while the third high-density plasma oxide layer 36 is formed within the trench. More specifically, even though the third high-density plasma oxide layer 36 may be formed on the upper surface of the substrate 30 or at the sides of the trench, this portion of the third high-density plasma oxide layer 36 is simultaneously removed by the $NF_3$ and hydrogen. Therefore, the third high-density plasma oxide layer 36 is built up strictly from the bottom of trench, thereby making it unlikely that any voids will be left in the layer.

Moreover, the etching process (S203) and the ISEA (S204) process can be subsequently repeated as necessary to completely fill the trench. For example, after the ISEA process (204) is performed, an etching process corresponding to that described above in connection with FIG. 10 is performed. Then, an ISEA process, corresponding to that described above in connection with FIG. 11 and another corresponding etching process may be performed one to five additional times. In this way, the trench can be filled without any voids being left in the material occupying the trench. Note, the ISEA process must be performed as the final process in this sequence.

Then, a capping layer may be formed over the resulting structure using a high-density plasma chemical vapor deposition method. Finally, a chemical mechanical polishing process is carried out beginning on the exposed capping layer to impart a flat surface to the structure.

Accordingly, to the present invention as described above, at least the etching of the deposition layer (stack of first and second high-density plasma oxide layers 32 and 34) which forms an overhang, and the subsequent (ISEA) process of forming the (third) high-density plasma oxide layer can be performed in the same processing chamber. Therefore, these processes can together be performed in a relative short amount of time. In this way, the present invention can enhance the overall productivity of the semiconductor device manufacturing process.

Finally, although the present invention has been described with reference to the preferred embodiments thereof, changes to and modifications of these embodiments may be apparent to those skilled in the art. Therefore, the above-described embodiments are illustrative of the present invention and not limiting. That is, changes to and modifications of the disclosed embodiments are seen to be within the true spirit and scope of the present invention as defined by the appended claims.

What is claimed is:

1. A method of filling a trench, comprising:
providing a substrate having an upper surface, and a trench extending therein from the upper surface;

forming a deposition layer of high-density plasma oxide on the upper surface of and within the trench of the substrate, including by inducing a reaction of oxygen and $SiH_4$ using plasma;

removing high-density plasma oxide from at least one of the upper surface of the substrate and the periphery of an upper part of the trench, including by inducing a reaction of $NF_3$ gas and oxygen using plasma; and subsequently removing high-density plasma oxide from sides of the trench, and simultaneously building up the deposition layer on the bottom of the trench with high-density plasma oxide, including by using a combination of $NF_3$, oxygen and $SiH_4$ and inducing a reaction of the oxygen and the $SiH_4$ using plasma;

wherein the forming of the deposition layer comprises forming a first high-density plasma oxide layer on the substrate, by inducing the reaction of oxygen and $SiH_4$ using plasma, subsequently adding $NF_3$ to oxygen and $SiH_4$, and etching the first high-density plasma oxide layer from sides of the trench using the $NF_3$, and simultaneously forming a second high-density plasma oxide layer on the first high-density plasma oxide layer by inducing a reaction of oxygen and $SiH_4$ using plasma, whereby the subsequent removing of high-density plasma oxide from sides of the trench, and the simultaneous building up of the deposition layer on the bottom of the trench forms a third high-density plasma oxide, and wherein the inducing of the reaction to form the second high-density plasma oxide layer or the third high-density plasma oxide layer comprises forming plasma from hydrogen.

2. The method of claim 1, wherein the inducing of the reaction to form the second high-density plasma oxide layer comprises spraying $NF_3$ into a chamber, in which the substrate is situated, from an upper part of the chamber at a flow rate of 40 sccm to 60 sccm, supplying oxygen into the chamber at a flow rate of 70 sccm to 100 sccm, supplying SiH4 into the chamber at a flow rate of a flow amount of 5 sccm to 15 sccm, supplying hydrogen into the chamber at a flow rate of 400 sccm to 700 sccm, and forming plasma from hydrogen supplied into the chamber.

3. The method of claim 2, wherein the inducing of the reaction to form the second high-density plasma oxide layer further comprises supplying high frequency power of 3000 W to 6000 W to a top electrode located at the upper portion of the chamber and to a side electrode located below the upper electrode at a side of the chamber, and supplying high frequency power of 1000 W to 2500 W to a bias electrode disposed below the substrate.

4. A method of filling a trench, comprising:

providing a substrate having an upper surface, and a trench extending therein from the upper surface;

forming a deposition layer of high-density plasma oxide on the upper surface of and within the trench of the substrate, including by inducing a reaction of oxygen and $SiH_4$ using plasma;

removing high-density plasma oxide from at least one of the upper surface of the substrate and the periphery of an upper part of the trench, including by inducing a reaction of $NF_3$ gas and oxygen using plasma; and subsequently removing high-density plasma oxide from sides of the trench, and simultaneously building up the deposition layer on the bottom of the trench with high-density plasma oxide, including by using a combination of $NF_3$, oxygen and $SiH_4$ and inducing a reaction of the oxygen and the $SiH_4$ using plasma;

wherein the forming of the deposition layer comprises forming a first high-density plasma oxide layer on the substrate, by inducing the reaction of oxygen and $SiH_4$ using plasma, subsequently adding $NF_3$ to oxygen and $SiH_4$, and etching the first high-density plasma oxide layer from sides of the trench using the $NF_3$, and simultaneously forming a second high-density plasma oxide layer on the first high-density plasma oxide layer by inducing a reaction of oxygen and $SiH_4$ using plasma, whereby the subsequent removing of high-density plasma oxide from sides of the trench, and the simultaneous building up of the deposition layer on the bottom of the trench forms a third high-density plasma oxide, and wherein the inducing of the reaction of $NF_3$ gas and oxygen comprises forming plasma from Ar.

5. The method of claim 4, wherein the inducing of the reaction of $NF_3$ gas and oxygen comprises supplying $NF_3$ into a processing chamber, in which the substrate is situated, at a flow rate of 150 sccm to 250 sccm, supplying Ar into the processing chamber at a flow rate of 100 sccm to about 200 sccm, and supplying oxygen into the processing chamber at a flow rate of 200 sccm to 300 sccm.

6. The method of claim 5, wherein the inducing of the reaction of $NF_3$ gas and oxygen further comprises supplying high frequency power of 4000 W to 6000 W to a top electrode located at an upper part of the processing chamber, supplying high frequency power of 500 W to 1500 W to a side electrode located below the top electrode at a side of the processing chamber, and supplying high frequency power of 1000 W to 1500 W to a bias electrode disposed below the substrate.

7. A method of filling a trench, comprising:

providing a substrate having an upper surface, a trench extending therein from the upper surface, and a hard mask layer exposed on the upper surface at the side of the trench;

etching the hard mask layer and simultaneously forming a first high-density plasma oxide layer on the substrate at the bottom of the trench, using $NF_3$, oxygen and $SiH_4$, wherein the etching of the hard mask layer and the simultaneous forming of the first high-density oxide layer each comprises inducing a reaction using plasma;

subsequently forming a second high-density plasma oxide over the entirety of the substrate, including by inducing a reaction of oxygen and $SiH_4$ gas using plasma;

removing high-density plasma oxide from at least one of the upper surface of the substrate and the upper periphery of an upper part of the trench, including by inducing a reaction of $NF_3$ and oxygen using plasma; and subsequently removing high-density plasma oxide from sides of the trench, and simultaneously forming a third high-density plasma oxide layer at the bottom of the trench, including by using a combination of $NF_3$, oxygen and $SiH_4$ and inducing a reaction of the oxygen and the $SiH_4$ using plasma.

8. The method of claim 7, further comprising repeatedly performing in sequence the processes in which a reaction of $NF_3$ gas and oxygen is induced using plasma to thereby remove a portion of the third deposition layer from at least one of the upper surface of the substrate and from the periphery of an upper part of the trench, and by which high-density plasma oxide is removed from sides of the trench while simultaneously the third deposition layer is formed on the bottom of the trench.

9. The method of claim 7, wherein the inducing of the reactions to form the first and third high-density plasma oxide layers each comprises forming plasma from hydrogen.

10. The method of claim 7, wherein the inducing of the reaction to form the second high-density plasma oxide layers comprises forming plasma from helium (He).

11. The method of claim 7, wherein the removing of high-density plasma oxide from at least one of the upper surface of the substrate and the upper periphery of an upper part of the trench comprises inducing a reaction of $NF_3$ and oxygen using plasma formed from Ar.

* * * * *